United States Patent [19]  [11] 3,961,982
DeLorenzo  [45] June 8, 1976

[54] METHOD OF REMOVING SILVER IMAGES FROM ALUMINUM LITHOGRAPHIC PLATES

[75] Inventor: Eugene J. DeLorenzo, Acton, Mass.

[73] Assignee: Itek Corporation, Lexington, Mass.

[22] Filed: Jan. 4, 1974

[21] Appl. No.: 431,007

[52] U.S. Cl. .................................. 134/3; 75/118 P; 101/465; 134/4; 134/41; 252/145
[51] Int. Cl.$^2$............................................. C23G 1/12
[58] Field of Search ............. 134/3, 4, 41; 252/79.2, 252/145, 142; 96/33, 86 R; 156/14, 3; 101/459, 465; 204/146; 75/118 P

[56] References Cited
UNITED STATES PATENTS

| | | | |
|---|---|---|---|
| 2,476,413 | 7/1949 | Heath et al. | 134/3 X |
| 3,242,857 | 3/1966 | Nadeau | 101/465 |
| 3,248,332 | 4/1966 | O'Connor | 252/79.3 X |
| 3,275,560 | 9/1966 | Wasserman et al. | 252/145 X |
| 3,367,806 | 2/1968 | Cullis | 156/3 X |
| 3,625,908 | 12/1971 | Magin | 134/3 X |
| 3,807,305 | 4/1974 | Gracia et al. | 96/48 PD X |

OTHER PUBLICATIONS
*McCutcheon's Detergents and Emulsifiers*, 1968, p. 234.

*Primary Examiner*—S. Leon Bashore
*Assistant Examiner*—Marc L. Caroff
*Attorney, Agent, or Firm*—Homer O. Blair; Robert L. Nathans; David E. Brook

[57] ABSTRACT

A coherent silver image which is bonded to the grained surface of an aluminum lithographic plate having an aluminum oxide layer thereon is transformed into a hydrophilic non-image area by contacting the silver image with a viscous composition comprising an aqueous nitric acid solution of sufficient concentration to rapidly effect the removal of the silver image and thereby expose the aluminum oxide under this image and wherein the viscous composition has a viscosity of at least about 500 centipoises. The preferred viscous composition is a thixotropic composition consisting essentially of (1) an aqueous solution of nitric acid present in an amount between about 35% and 70% by volume based upon the total volume of nitric acid solution, and (2) finely divided inert metal oxide capable of imparting thixotropic properties to the solution.

6 Claims, No Drawings

METHOD OF REMOVING SILVER IMAGES FROM ALUMINUM LITHOGRAPHIC PLATES

BACKGROUND OF THE INVENTION

1. Field of the Invention

This invention relates to silver imaged aluminum plates such as printing plates and to acid solutions useful for deleting these silver images from the plate surface.

2. Description of the Prior Art

Silver imaged aluminum printing plates are well known in the art as evidenced by the well known silver halide diffusion transfer process for making printing plates. The capability of deleting unwanted silver image areas is very important due to the time, materials, and labor savings in not having to make a new printing plate to replace plates containing unwanted silver images. This capability is even more important if the imperfection is not discovered until the plate is on the printing press due to the very high cost of press time especially on the large presses. Due to the very small amount of silver present in the image areas of the silver halide diffusion transfer plates, i.e., less than 1 gram of silver per square meter, any unwanted silver image portions can readily be removed by simple mechanical means such as use of an ordinary rubber pencil eraser. However, in a process disclosed in copending applications U.S. Ser. No. 54,627, filed July 13, 1970 now U.S. Pat. No. 3,807,304 and U.S. Ser. No. 320,426, filed Jan. 2, 1973, abandoned, each of which is incorporated herein by reference, a printing process is described wherein the silver imaged printing plate is produced having run length capability considerably in excess of that previously capable of being produced by the silver halide diffusion transfer printing plate mentioned previously. This longer run length printing plate contains coherent silver images adherently and intimately bonded to an aluminum support which is preferably grained and anodized. The grain of the support is preferably at least about 1 micron in depth and may be produced by any of the common techniques known to the art such as brush graining, chemical graining, or sand blasting. The silver in the areas of maximum density of these new long run printing plates contain in excess of 1 gram of silver per square meter and preferably between about 3 and about 12 grams of silver per square meter. Preferably the anodization has been carried out to produce a barrier oxide layer at least about 100 A in thickness.

Attempts to utilize ordinary mechanical means for deleting unwanted silver images from these new silver imaged printing plates has proved unsuccessful. Using a rubber pencil eraser either takes too long or removal of the silver image is not possible. Using more abrasive mechanical eraser means suffers from the problem of either being too slow, image removal is incomplete because some of the silver is still present in the grain of the plate or the oxide layer on the aluminum plates is removed thereby exposing bare aluminum requiring extra steps to convert the more oleophilic exposed bare aluminum areas to hydrophilic areas. Ordinary acid and alkali deletion fluids known to the art are either of inadequate strength to remove the silver as rapidly as desired, i.e., in a time period of 2 or 3 minutes or less, or the solution such as that of sodium hydroxide was so strong that it would remove the aluminum oxide layer thus exposing bare aluminum and creating problems as mentioned above.

Additionally, any method of deleting silver images should be useful when the silver imaged aluminum support is in a vertical position since often the silver imaged printing plate is already in position on the printing press and it is most convenient to delete unwanted images while the plate is still on the plate drum. Access to the plate may be most convenient when the plate is in a vertical or other irregular position besides facing upward in a horizontal position. Thus a conventional liquid chemical deletion fluid is not satisfactory for deleting images from plates in these irregular positions since it runs off from the image to be deleted thus resulting in incomplete and non-selective deletion.

SUMMARY OF THE INVENTION

This invention provides a method of rapidly and selectively removing unwanted silver images from an aluminum substrate even when the substrate is in an irregular position such as in a vertical position. The image removal method can readily remove 8 to 12 grams of silver or more per square meter from an anodized plate having a grain depth of greater than 1 micron in less than one minute and preferably in about 5 to 20 seconds. Furthermore, the aluminum oxide exposed by the image removal is the same type of hydrophilic aluminum oxide present in non-image areas of the plate. Optionally the hydrophilicity of this aluminum oxide may be increased by art recognized treatments.

The method according to this invention comprises contacting the silver image with a viscous composition comprising an aqueous nitric acid solution of sufficient concentration to rapidly effect the removal of the silver image and thereby expose the aluminum oxide under this image and wherein the viscous composition has a viscosity of at least about 500 centipoises. Preferably, the viscous composition is a thixotropic composition which can readily be applied by brushing or by means of a hand squeegee bottle operated manually and having an orifice of less than about 3 mm in diameter.

The preferred deletion composition according to this invention consists essentially of (1) an aqueous solution of nitric acid, and (2) finely divided inert metal oxide capable of imparting thixotropic properties to the composition and wherein the viscosity of the viscous composition is at least about 500 cps.

Also considered to be a part of this invention is a grained aluminum plate having an aluminum oxide layer thereon and having adherently and intimately bonded thereto a silver image wherein the silver is present in at least some portions in an amount of greater than about 1 gram per square meter and a thin layer of viscous aqueous nitric acid solution, the width of said film being less than about 3 mm and wherein the viscous solution is of sufficient viscosity that when the aluminum plate is placed in a vertical position the viscous nitric acid solution remains substantially immobile.

The preferred image removal system for the silver imaged grained anodized lithographic plate wherein the silver image contains some portions having between about 1 and about 12 grams of silver per square meter and which silver image is adherently and intimately bonded to the plate surface comprises (1) a viscous aqueous nitric acid solution having a viscosity of at least about 500 cps, (2) a container means for the viscous nitric acid solution, and (3) dispenser means capable of dispensing the viscous nitric acid solution in a bead of less than about 3 mm in width onto the aluminum plate surface.

DESCRIPTION OF THE PREFERRED EMBODIMENTS

The aluminum plate containing silver images for which the deletion fluid of this invention is designed is one such as described in the above-mentioned copending U.S. patent applications and preferably contains silver images at least some portions of the plate present in an amount of 1 gram per square meter or greater and preferably between about 3 and about 12 grams per square meter. These images are preferably adherently and intimately bonded to the support comprised of aluminum and an aluminum oxide layer. Preferably, the grain is at least 1 micron in depth and may be 4 microns in depth or greater as described in copending U.S. application Ser. No. 417,860, filed in Nov. 1973 and entitled PRINTING PROCESS AND PLATES USEFUL FOR REPRODUCING CONTINUOUS TONE IMAGES in the names of R. Gary and R. Gracia, incorporated herein by reference. Preferably, the aluminum oxide layer on the aluminum plate is formed by anodization so as to form a barrier oxide layer having a thickness of greater than about 100 A and suitable for use on a lithographic printing press.

The viscosity of the viscous deletion composition of this invention is at least about 500 centipoises. Preferably, the composition is thixotropic and can readily be applied by brushing or by means of a hand squeegee bottle operated manually having an orifice of less than about 3 mm in diameter. Preferably, the viscous solution is of sufficient viscosity so that when the aluminum plate is placed in a vertical position and the viscous solution is applied to the plate surface, the viscous nitric acid solution remains substantially immobile. Preferably, the viscosity is between 20,000 and 80,000 cps. Preferably, the viscous agent is a finely divided inert metal oxide capable of imparting thixotropic properties to the composition. However, any suitable viscous agent which will be compatible with the nitric acid solution will be satisfactory. A preferred metal oxide is silicon dioxide having a particle size of less than about 1 micron and more preferably wherein the composition additionally comprises a surfactant, such as octyl phenoxy polyethoxy ethanol sold under the Trademark Triton X-100, as a dispersing agent for the silicon dioxide.

The viscosity of the viscous composition of this invention is measured at 26.5°C using conventional methods for measuring viscosities. A preferred method for measuring viscosity of the preferred thixotropic compositions of this invention uses the Brookfield LVF Viscometer with the Helipath Stand and T-BAR spindle in a 600 cc beaker.

The preferred image removal system of this invention is one as described above comprising (1) a viscous aqueous nitric acid solution, (2) a container means for the viscous nitric acid solution, and (3) a dispenser means capable of dispensing the viscous solution in a bead of less than about 3 mm in width onto the aluminum plate surface and preferably in a bead of less than about 1 mm in width. A preferred system is a squeegee bottle such as one made of a flexible plastic so that hand pressure can force the viscous nitric acid solution from a small orifice, such as less than ½ mm in diameter, onto the plate surface. A small stick having a ball of cotton on its end can then be utilized to move the viscous solution onto adjacent areas of the plate if so desired.

The nitric acid solution of this invention is preferably an aqueous solution of sufficient concentration to readily remove an image containing 1 to 12 grams of silver per square meter in less than about one minute time and preferably in less than 5 to 20 seconds time. Preferably, the nitric acid is present in an amount between about 35% and 70% by volume of the total solution and more preferably in an amount between about 40% and about 60% by volume. An especially preferred composition is one in which the nitric acid is present in an amount of about 50% by volume based upon the total volume of water and nitric acid and additionally wherein the viscous solution comprises finely divided inert silicon dioxide having a particle size of less than about 1 micron.

EXAMPLES

A deletion fluid for use on silver imaged aluminum printing plates is prepared having the following composition:

250 g Nitric Acid Solution (e.g. 50% by volume)
5.0 g Triton X-100 surfactant
15.0 g Cabosil M5 thickener Deletion fluids of identical composition except for varying the concentration of the nitric acid solution were also prepared. The concentrations of acid solution prepared were 10, 25, 35, 50 and 70 percent by volume. The resultant deletion fluids were thixotropic with viscosities ranging from approximately 23,000 to 80,000 cps at 26.5°C. These were measured using the Brookfield LVF Viscometer with the Helipath Stand and T-bar spindles in a 600 cc beaker.

The effectiveness of the various deletion fluids were measured by contacting each fluid with solid images of measured silver content for various times, then measuring the residual silver by x-ray fluorescence.

In one test, performed when the deletion fluids were 3 days old, each fluid was uniformly applied to a group of four solid silver image areas (each 2 × 2 inches) on a brush grained, anodized aluminum plate using a shimmed wire rod which applied a uniform film 1½ mm thick. The fluid was then rinsed from successive areas after 5, 10, 20 and 60 seconds. An adjacent column of untreated solid image areas was used to estimate the original silver content. Examination of the data indicates that the original silver contents for a group of four images vary up to 15% because of processing and process variations. Residual silver in treated areas was expressed as a percentage of the estimaged original. All solid image areas were formed on brush grained, anodized aluminum plates having a grain depth of about 1 micron and a barrier oxide layer of about 200A having a silver chloride polyvinyl alcohol emulsion having a dry thickness of about 0.02 micron. These plates were exposed 60 seconds to a 4,000 watt pulsed Xenon light source 30 inches away, then processed 3 minutes in a silver ion/ferrous/ferric stabilized physical developer. Results are given in Table I.

Table I

Effectiveness of Deletion Fluids - 3 Days Old
Residual % vs. Acid Concentration

| Contact time, sec. | 10% | 25% | 35% | 50% | 70% |
|---|---|---|---|---|---|
| 5 sec. | 100% | 100% | 100% | 0.6% | 6.6% |
| 10 sec. | " | " | " | 0.6 | 4.2 |
| 20 sec. | " | " | " | 0.8 | — |
| 60 sec. | " | " | " | 0.7 | 2.2 |
| Amt. of silver in silver image (g/m²) | 9.4±0.7 | 10.2±.4 | 9.4±.9 | 10.0±0.6 | 11.5±.1 |

A second test of effectiveness was performed after the fluids had been left at room conditions for 20 days. Each fluid was uniformly applied 1½ mm thick to three of a group of four solid image areas. The fluid was rinsed from successive areas after 10, 20 and 60 seconds respectively. The silver in the untreated area was used to estimate the original content and all were measured by X-ray. These results, expressed as a residual percentage, are given in Table II.

Table II

Effectiveness of Deletion Fluid - 20 Days Old
Residual % vs. Acid Concentration

| Contact time, sec. | 10% | 25% | 35% | 50% | 70% |
|---|---|---|---|---|---|
| 10 sec. | 100% | 100% | 100% | 1.1% | 4.1% |
| 20 | " | " | ~95 | 0.1 | 1.2 |
| 60 | " | " | ~93 | 0.1 | 0.2 |
| Amt. of silver in silver image (g/m²) | 9.3 | 9.1 | 8.4 | 9.0 | 8.0 |

The measured viscosities of the various fluids are given in Table III. Readings were somewhat unstable.

Table III

Measured Viscosities of Deletion Fluids
(temperature = 26.5°C)

| Vol. % HNO₃ | Reading | Viscosity, cps |
|---|---|---|
| 10 | 55–60 | 48,000 |
| 25 | 60–75 | 56,000 |
| 35 | 25–30 | 23,000 |
| 50 | ~100 | ~80,000 |
| 70 | ~35 | ~29,000 |

The fluid prepared using 50% by volume $HNO_3$ is by far the most effective. Silver removal is essentially complete in 5–10 seconds.

I claim:

1. In the method of transforming portions of an oleophilic coherent silver image containing between about 1 and about 12 grams of silver per square meter and bonded to a grained metal surface of an aluminum lithographic plate substrate having a metal oxide barrier layer thereon into hydrophilic areas by contacting said portions with a deletion fluid, the improvement wherein said deletion fluid comprises an aqueous nitric acid solution containing from about 35% to about 70% by volume nitric acid and a finely divided inert metal oxide thickening agent present in an amount sufficient to provide said deletion fluid with a viscosity of at least about 500 centipoises.

2. The improvement according to claim 1 wherein said deletion fluid also contains a surfactant for the thickening agent.

3. The improvement according to claim 2 wherein said aqueous nitric acid solution contains from about 40% to about 60% by volume nitric acid.

4. The improvement according to claim 3 wherein said deletion fluid has a viscosity of between about 20,000 and about 80,000 centipoises.

5. The improvement according to claim 4 wherein said finely divided inert metal oxide comprises silicon dioxide having an average particle size of less than about 1 micron.

6. The improvement according to claim 5 wherein said aqueous nitric acid solution contains about 50% by volume nitric acid.

* * * * *